United States Patent [19]

Cenker et al.

[11] 4,183,096
[45] Jan. 8, 1980

[54] SELF CHECKING DYNAMIC MEMORY SYSTEM

[75] Inventors: Ronald P. Cenker, Coplay, Pa.; Thomas W. Fleming, Naperville; Frank R. Huff, Winfield, both of Ill.

[73] Assignee: Bell Telephone Laboratories, Incorporated, Murray Hill, N.J.

[21] Appl. No.: 909,367

[22] Filed: May 25, 1978

[51] Int. Cl.² ............................................ G11C 13/00
[52] U.S. Cl. .................................... 365/222; 307/238
[58] Field of Search ........................ 365/222; 307/238

[56] References Cited

U.S. PATENT DOCUMENTS 3,801,964   4/1974   Palfi et al. ........................ 365/222

*Primary Examiner*—Terrell W. Fears
*Attorney, Agent, or Firm*—Kenneth H. Samples

[57] ABSTRACT

The storage space of the instant system is considered, for refresh purposes, to contain 512 groups of 26 bit digital words with each group containing 128 such words. Memory refresh is implemented by sequentially refreshing the groups of digital words at the rate of one group every 2.8 microseconds, giving an expected total memory refresh time of approximately 1.43 milliseconds. A particular digital word from each group of digital words refreshed is read from the memory and transmitted to a parity check circuit which generates fault signals for any digital word having faulty parity. At the end of each of the approximately 1.43 millisecond refresh cycles, the particular word read from each group refreshed is changed so that at the end of 128 full refresh cycles (approximately 184 milliseconds), the parity of every digital word in the memory has been checked. Further, circuitry is provided to store the location of the first failing digital word in a trap register in response to an indication of faulty parity.

12 Claims, 6 Drawing Figures

REFRESH CONTROL

MEMORY ACCESS CONTROL & REFRESH ENABLE

SELF CHECKING DYNAMIC MEMORY SYSTEM

BACKGROUND OF THE INVENTION

This invention relates to dynamic memory refresh systems and more particularly to systems for performing continuous integrity checks of the information stored by such systems.

The storage of digital information is essential to the proper operation of digital computing systems. Many types of storage are available to the designer to be chosen or not, based upon their individual attributes. Dynamic random access memory is utilized in many systems where rapid access to digital information stored thereby is desired. A dynamic memory requires that the information stored by the individual memory cells be periodically refreshed to avoid loss of information. This adds a small amount of circuitry to the memory system but, if the memory refresh system is properly designed, if does not add significantly to the memory access time. It has been found desirable in dynamic memory systems to have a current indication of the integrity of the information stored therein. This is particularly true in systems which have duplicated information storage since early detection of faulty information can be used as a signal to remove the faulty memory from service and replace it with its duplicate. When a memory is removed from service, the information stored thereby can be updated from a master record such as a disk memory or, if necessary, diagnostic tests can be performed to isolate and correct system faults.

The present invention provides a continuous indication of the integrity of information stored by a dynamic memory system which, when properly associated with the refresh operations of the memory system, adds very little additional circuitry and virtually no increase in access time.

SUMMARY OF THE INVENTION

The fault detection system in accordance with the present invention includes a dynamic memory for storing a plurality of digital words each having a unique memory location and a refresh arrangement which successively performs refresh operations on the memory. During each refresh operation a group of digital words is refreshed. A digital word reading arrangement operates in conjunction with the refresh arrangement to read from the memory one word of each group refreshed. Each digital word read by the reading arrangement is applied to an error check circuit which determines if errors are present in the word applied thereto and generates fault signals when the digital word checked contains an error.

In a dynamic memory system having m groups of digital words each group containing n digital words the refresh arrangement successively refreshes all m groups of digital words and the reading arrangement reads the same digital word from each group refreshed. When all m groups have been refreshed the particular word read from memory by the reading arrangement is changed so that a new word is read during the next m refresh operations. Accordingly, after n sets of m refresh operations all digital words have been checked for accuracy. As an additional aspect of the present invention circuitry is provided for storing the location of any digital word found to be in error.

In accordance with one embodiment of the present invention, the memory portion consists of 416-4,096 by one bit dynamic random access memory circuits giving a total storage space for 65,536 twenty-six bit words. The storage space is considered, for refresh purposes, to contain 512 groups of 26 bit digital words with each group containing 128 such words. Memory refresh is implemented by sequentially refreshing the groups of digital words at the rate of one group every 2.8 microseconds, giving an expected total memory refresh time of approximately 1.43 milliseconds (512×2.8 microseconds). The tme period for a total refresh of the memory is referred to herein as a refresh *cycle* while the time required to refresh a group of 128 words (approximately 2.8 microseconds) is referred to as a refresh *operation*. For reasons described later herein, the actual time for both a refresh cycle and a refresh operation may vary slightly. During each refresh operation, a particular one of the words refreshed is read from the memory and transmitted to a parity check circuit. At the end of each of the approximately 1.43 millisecond refresh cycles, the particular word read from memory during each refresh operation is changed so that at the end of 128 full refresh cycles (approximately 184 milliseconds), the parity of every digital word in the memory has been checked. Further, circuitry is provided to store the location of the first failing digital word in a trap register in response to an indication of faulty parity. This information can be used as a powerful fault location tool during the performance of diagnostic tests.

BRIEF DESCRIPTION OF THE DRAWING

The following description will be more readily understood when read in conjunction with the drawing wherein.

DESCRIPTION

Figure 1:
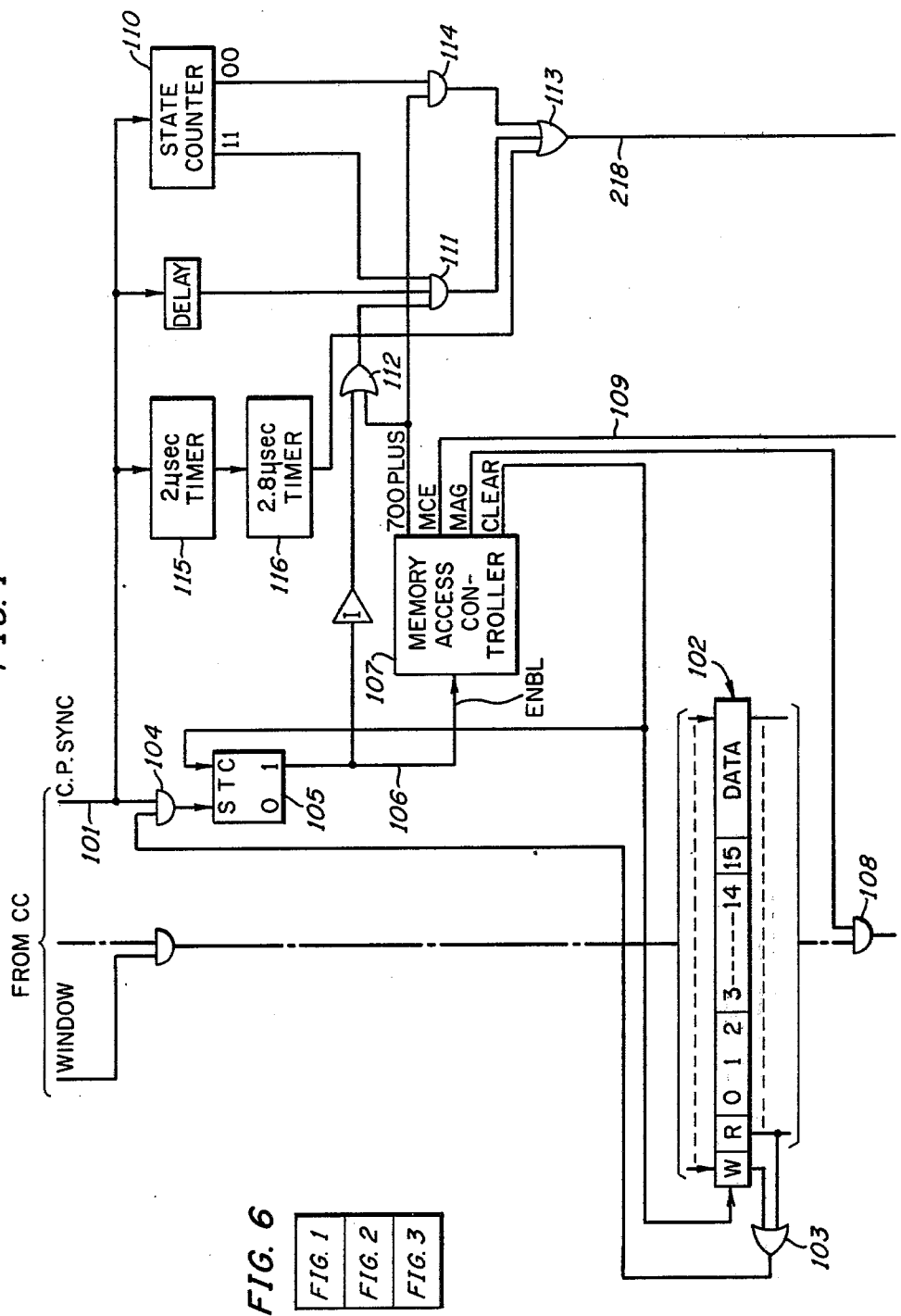
FIGS. 1, 2 and 3 when arranged in accordance with FIG. 6 comprise a block diagram of an embodiment of the present invention.
Figure 2:
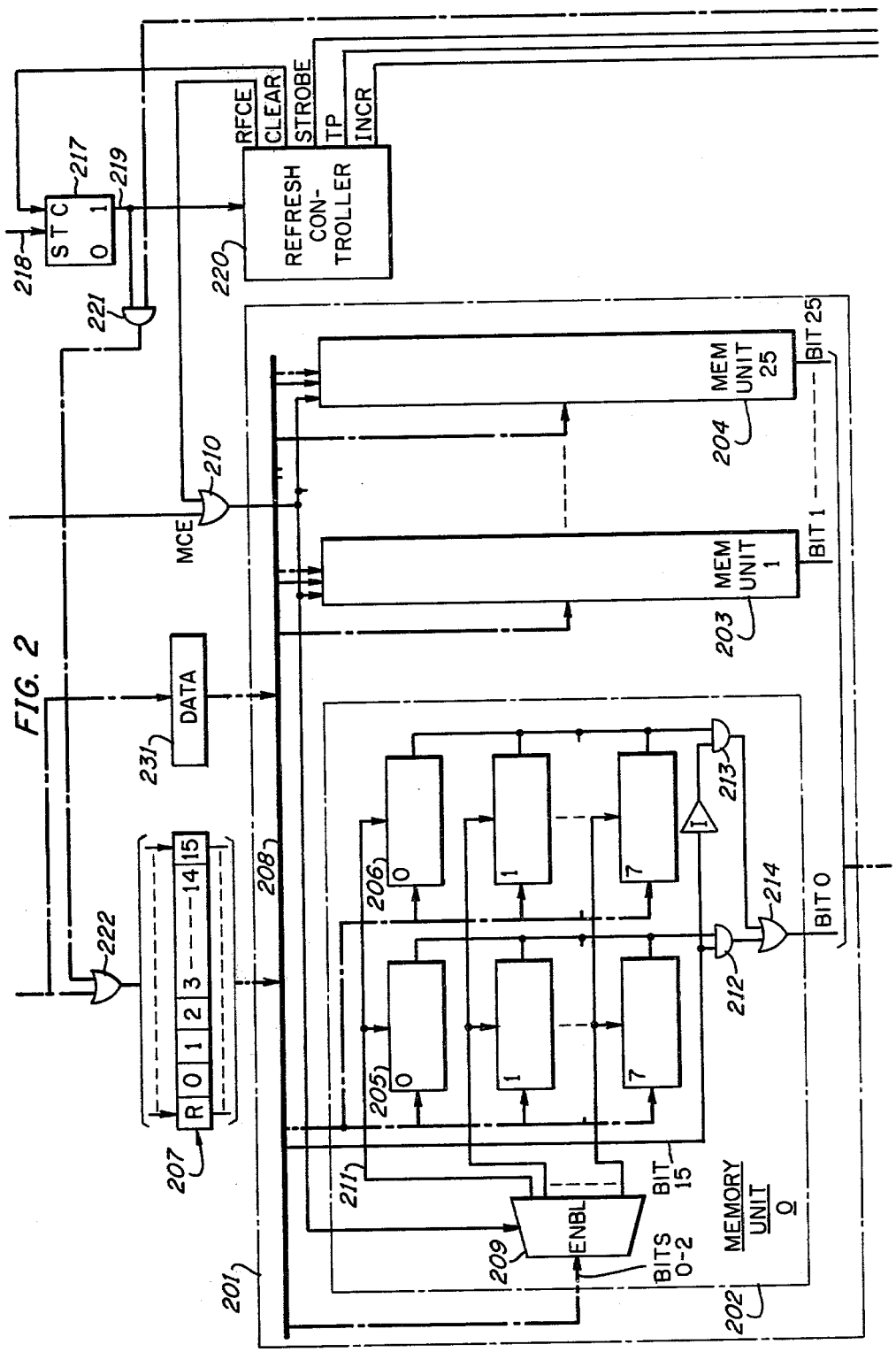
Figure 3:
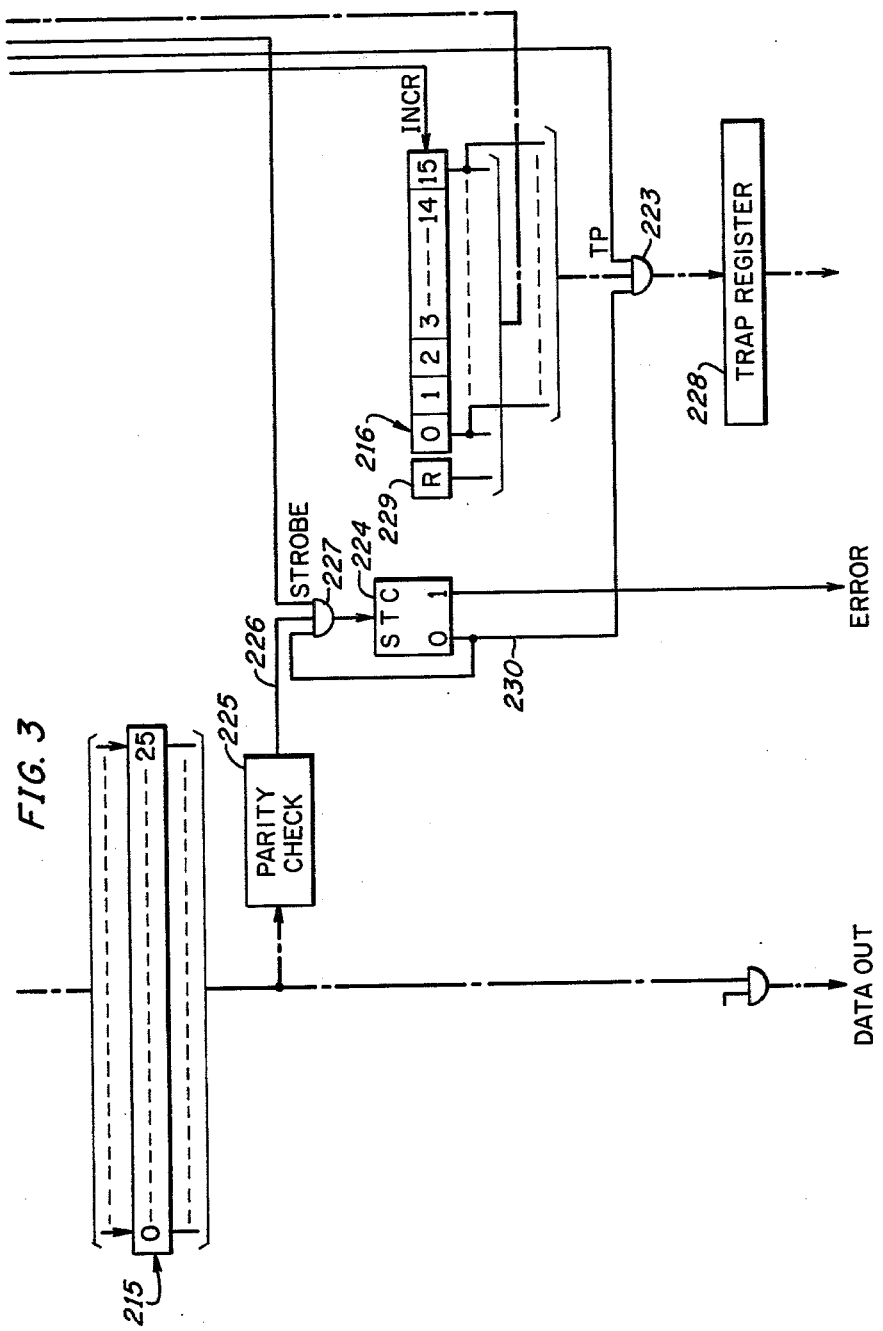

The embodiment of FIGS. 1, 2 and 3 includes a memory 201 capable of storing 65,536 (64K) digital words each comprising twenty-six binary digits. Each twenty-six digit word consists of twenty-four information digitals and two error check digits. In the present embodiment each error check digit is a parity digit over a portion of the twenty-four information digits. Memory 201 consists of twenty-six memory units of which memory units 202, 203, and 204 are shown in FIG. 2. When a word is read from memory 201, one of its digits is transmitted from each of the twenty-six memory units. Each of the memory units 202 through 204 consists of sixteen memory circuits as shown in the detailed drawing of memory unit 202. The uppermost two memory circuits of memory unit 202 have been numbered memory circuits 205 and 206. The memory circuits of the present embodiment may, for example, be the Texas Instruments type TMS 4050-4096 bit dynamic random access memories. A single digit is read from or written into a given memory circuit, when it receives a twelve-bit address portion, a designation of whether a read or write operation is to occur and a chip enable signal. Sixty-four memory cells of each memory circuit can be simultaneously refreshed by providing the memory circuit with a read indication, a six-bit row address and a chip enable signal.

All access to the memory 201 is obtained by address and control information placed in a seventeen-bit memory address register 207 (FIG. 2). One bit position of memory address register 207, denoted R, is a logical "1" if a read operation is to be performed and a logical "0" if a write operation is to be performed. Bit positions 0 through 2 of memory address register 207 define two memory circuits within each memory unit which are to be accessed. Bit positions 3 through 8 define which row of the selected memory circuits contains the bit of interest. Bit positions 9 through 14 define which column of the selected memory circuits includes the bit of interest and storage position 15 defines which of the two selected memory circuits per memory unit is to provide (or store) the information digit. The address information contained in storage locations 3 through 14 is directly connected via a bus 208 to the appropriate input terminals of the memory circuits of each of the memory units 202 through 204 in accordance with principles well known in the art.

In the description which follows, the operations performed within memory unit 202 are described in detail. However, identical operations are being performed in response to the same information in all of the memory units 202 through 204, each being used, as previously stated, to supply one bit of the resulting twenty-six bit word. The information in bit positions 0 through 2 of memory address register 207 is connected to an enable decoder 209 in each memory unit over bus 208. Enable decoder 209 is also connected to receive the output signals of an OR gate 210. As will be described in greater detail later herein, OR gate 210 receives as inputs all chip enable signals generated by the control circuitry of the present memory system whether generated as a part of a refresh operation or as part of a normal memory access. The chip enable signals are transmitted through OR gate 210 to the enable decoder 209 of each memory unit. Enable decoder 209 responds to the contents of bit positions 0 through 2 of memory address register 207 by gating the received chip enable signal to two memory circuits defined by those three bit positions. For example, if the contents of bit positions 0, 1, and 2 are all logical "0s" enable decoder 209 transmits the chip enable pulse to memory circuits 205 and 206 over a conductor 211 uniquely associated with those two memory circuits. Upon receipt of the chip enable signal, the function defined by bit position R of memory address register 207 will be performed on the particular bit defined by storage positions 3 through 14 of memory address register 207. When a read operation is performed the information from a single defined storage position in both enabled memory circuits 205 and 206 is transmitted to a respective one of AND gates 212 and 213. The binary state of bit position 15 of memory address register 207 is transmitted directly to AND gate 212 and via an inverter to AND gate 213. Accordingly, if bit position 15 of memory address register 207 stores a logical "1," the accessed bit from memory circuit 205 will be gated by AND gate 212 to an OR gate 214. On the other hand, if bit position 15 of memory address register 207 is a logical "0," the accessed digit from memory circuit 206 will be gated by AND gate 213 to OR gate 214. The output of OR gate 214 of memory unit 202 is directly connected to a uniquely associated bit position in an output register 215. Each of the memory units 202 through 204 is uniquely associated with one of the twenty-six bit positions of output register 215 and simultaneously operates in response to the contents of memory address register 207 to transmit a single digit to that register.

Two sources of addresses are available to supply the contents for memory address register 207. One source, which is utilized when a memory access is desired by the central processor, is a register 102. The second source, and the one described in greater detail immediately herein, is a counter circuit 216. Counter circuit 216 comprises a sixteen bit position binary counter which is initialized to a value of 0 and adds a 1 to its stored contents in response to each input signal INCR. When a signal INCR is received by counter circuit 216 while it is in the all "1s" state, its contents become all "0s" and the cycle repeats. Bit positions 0 through 8 of counter circuit 216 define a group of 128 digital words to be refreshed while bit positions 9 through 15 define which word of that refreshed group is to be read from memory. Associated with counter circuit 216 is a read designator 229 which is a permanent logical "1" and is transmitted to bit position R of memory address register 207 whenever the contents of counter circuit 216 are so transmitted.

Three basic arrangements are provided for initiating refresh cycles. The memory system of the present invention normally operates in response to synchronizing pulses transmitted from a central processing circuit (not shown) on a conductor 101. When no memory access is requested by the central processor, refresh cycles start in response to the synchronizing pulses from the central processor. When a memory access request from the central processor is present, arrangements are provided so that the refresh operation is hidden from central processor functions, i.e., refresh will not delay central processor access. Additionally, in the case that communications with the central processor cease, a system of timers is employed to activate the refresh cycles independently of the synchronizing signals from the central processor. The following description relates to the operations during a given refresh cycle. A more detailed description of the commencement of a refresh cycle is given later herein.

Figure 4:
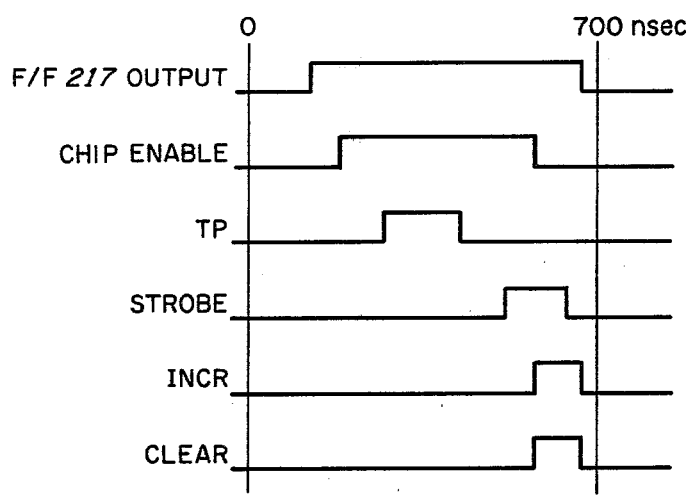
FIGS. 4 and 5 are timing diagrams useful in the understanding of FIGS. 1, 2 and 3.

A refresh operation is commenced when a logical "1" is applied as an input to flip-flop 217 via a conductor 218. Flip-flop 217 responds to the logical "1" at its input terminal by transmitting a logical "1" via conductor 219 to a refresh controller 220. FIG. 4 is a timing diagram showing the timing and control signals generated to enable a refresh operation including certain signals generated by the refresh controller 220. It should be noted that each refresh operation is performed within one 700 nanosecond time period which, as will be described later herein, is a basic functional time period for the memory system. The logical "1" output of flip-flop 217 is also applied to an AND gate 221. AND gate 221 is shown as a single AND gate; however, it actually comprises seventeen AND gates, each uniquely associated with a particular bit position of counter circuit 216 or with the read designator 229. The contents of counter circuit 216 and the read designator 229 are transmitted via AND gate 221 and OR gate 222 to memory address register 207. Refresh controller 220 responds to the logical "1" from flip-flop 217 by generating the chip enable signal (FIG. 4) which is transmitted via OR gate 210 to enable decoder 209 in each of the memory units 202 through 204. As previously described, this chip enable signal is transmitted to the two memory circuits selected by the enable decoder in each memory unit.

Refresh controller 220 further generates a trap signal TP which is applied to an AND gate 223. AND gate 223 also receives as inputs both portions of the address presently stored by counter circuit 216 and the "0" output of a flip-flop 224. In the manner previously described, one bit from each of the memory units is transmitted to an associated bit position of output register 215. The contents of output register 215 are applied directly to a parity check circuit 225. Parity check circuit 225 computes the parity of the twenty-four information digits in output register 215 and compares that with the two-digit error check code accessed from memory. If the two are identical, it takes no further action. If the two do not match, a logical "1" is applied to an AND gate 227 via a conductor 226. It is the function of AND gates 223 and 227 and flip-flop 224 to generate an error indication in response to a parity failure during a refresh operation and to retain the address contained by counter circuit 216 in trap register 228 in response to the first parity failure detected by parity check circuit 225.

Flip-flop 224 is normally in the logical "0" state which results in the transmission of a logical "1" to AND gate 223 via conductor 230. Accordingly, whenever a trap signal TP is generated by the refresh controller 220, the then current contents of counter circuit 216 are placed in trap register 228. It should be mentioned that the inputs to trap register 228 are the type referred to as double rail, meaning that no reset pulse is necessary to clear the contents of the trap register. As long as flip-flop 224 continues to store a logical "0," the contents of the counter circuit 216 will be transmitted to trap register 228 during each refresh operation. If the parity check circuit 225 detects a parity failure, a logical "1" is applied as one input to AND gate 227. If flip flop 224 is in the "0" state, conductor 230 further applies a logical "1" as another input to AND gate 227. When the signal STROBE (FIG. 4) is generated by refresh controller 220, it is further applied as an input to AND gate 227. This input signal condition of AND gate 227 causes it to transmit a logical "1" output to the toggle input of flip-flop 224 in response to which flip-flop 224 changes state to the logical "1" state. The logical "1" output of flip-flop 224 is a parity failure signal. The logical "1" state of flip-flop 224 results in a logical "0" being transmitted on conductor 230 which inhibits AND gate 223 from gating any further information from counter circuit 216 to the trap register 228. That is, the contents of counter circuit 216 at the time the parity check failure was detected are stored in trap register 228 and will not be changed until the state of flip-flop 224 is changed. The logical "0" on conductor 230 is also returned to inhibit AND gate 227 from transmitting any further logical "1s" to the toggle input of flip-flop 224. Accordingly, the state of flip-flop 224 will not be changed until a clear signal is applied to its clear input. This clear signal will be applied either by the central processor during diagnostic and fault recovery routines or by an individual who is attempting to diagnose the malfunction in the memory system. It should be noted that each address generated by counter circuit 216 is temporarily placed in trap register 228. This is purely transitory in nature and no address is considered to be stored in trap register 228 until the change of state of flip-flop 224 in response to a parity failure indication from parity check circuit 225. Near the end of each refresh operation refresh controller 220 generates the signal INCR (FIG. 4) which is transmitted to counter circuit 216. Counter circuit 216, in response to this signal increments its contents in preparation for the next refresh operation. Refresh controller 220 also generates a clear signal which is transmitted to a clear input terminal of flip-flop 217 which responds thereto by storing a logical "0," thus terminating the refresh operation.

The above description of a single refresh operation provides the basis from which the overall refresh cycle is produced. During each refresh operation, a group of 128 digital words is refreshed. The particular group refreshed being defined by the address portion comprising bits 0 through 8 of counter circuit 216. By the advantageous operation of counter circuit 216 and its connection to memory address register 207, the entire memory is refreshed after 512 refresh operations. When each refresh operation requires approximately 2.8 microseconds, a total refresh cycle can be completed in approximately 1.43 milliseconds. During each refresh operation, a given memory word, defined by the second address portion defined by bit positions 9 through 15 of counter circuit 216, will be read from the memory and applied to parity check circuit 225. After each refresh cycle, comprising 512 refresh operations, counter circuit 216 adds one to second address portion of counter circuit 216, causing the parity check circuit to receive a new set of digital words from the memory during the next 512 refresh operations. When operating in accordance with this description, a new set of digital words will be read from the memory during each 512 refresh operation-refresh cycle. After 128 times through the entire refresh cycle, every digital word stored by the memory system will have been applied to parity check circuit 225. If any parity failures have occurred, the address of the first failing digital word is stored in trap register 228. If no parity failures have occurred, then it is known that the system contains only good data.

As above described, a refresh operation is commenced three different ways. One of these ways comprises the performance of a refresh operation in conjunction with a memory request from the central processor in such a manner that the central processor request is not delayed by a refresh operation. Whenever the central processor requires access to memory, it transmits the desired address (and data when a memory write is to be performed) to the memory system just prior to a memory sync pulse on conductor 101. The information transmitted by the central processor to the memory system includes a control portion which defines whether a read or a write operation is to be performed and a gate pulse which gates the address, data and control portion into register 102. In the present embodiment the control portion comprises two mutually exclusive digits designated R and W in FIG. 1. When a read operation is to be performed the digit R=1 and the digit W=0. Conversely, if a write operation is to be performed the digit W=1 and the digit R=0. The R and W digits are transmitted from register 102 as inputs to an OR gate 103 the output of which is connected as an input to an AND gate 104. Accordingly, whenever a memory access is requested by the central processor OR gate 103 will transmit a logical "1" to one input of AND gate 104. The other input of AND gate 104 is connected to conductor 101 which receives the sync pulses from the central processor. At the next occurring sync pulse after an access request has been received by register 102, AND gate 104 generates a logical "1" output which is transmitted to the toggle input of a flip-flop 105. Flip-flop 105 responds to the logical "1" input by assuming the logical "1" state and transmitting a logical "1" on an output conductor 106 to a memory access control circuit 107 which responds thereto by generating certain gating signals shown in FIG. 5.

Figure 5:
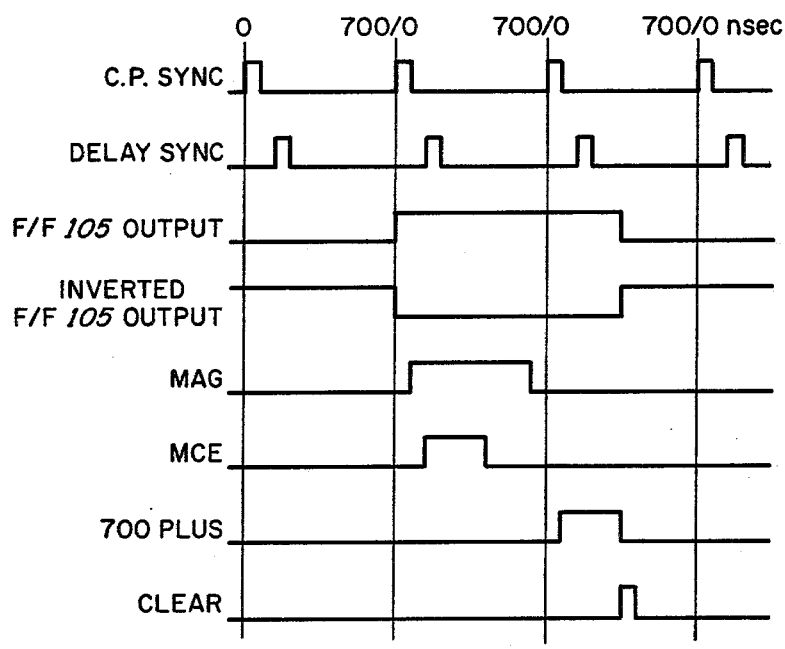

The contents of register 102 excluding the digit W, are transmitted as inputs to an AND gate 108. AND gate 108 is in actuality a plurality of AND gates, one corresponding to each of the storage positions of register 102 except the W storage position. However, for the sake of simplicity, it is shown in FIG. 1 as a single gate. When enabled, memory access control circuit 107 generates a logical "1" memory address gating signal (MAG; FIG. 5) which is transmitted to AND gate 108. Signal MAG enables AND gate 108 to transmit the address portion and the R digit from register 102 to memory address register 207 via OR gate 222. Enabling AND gate 108 also transmits the data portion of register 102 to a data register 231. After a sufficient period of time has passed so that the information transmitted to memory address register 207 and data register 231 is known to be stable, memory access control circuit 107 transmits a memory chip enable signal (MCE; FIG. 5) on conductor 109. Signal MCE is transmitted via OR gate 210 to all of the memory units 202 through 204. Memory units 202 through 204 respond to the input address and the memory chip enable signal from memory access control circuit 107 by performing the read or write operation requested, as defined by the status of the R bit.

Either read or write operations are completed within 700 nanoseconds of the sync pulse from the central processor. However, by design memory access requests are transmitted from the central processor only once every 1400 nanoseconds. All of the storage cells of memory 201 can be refreshed within the required time period if refresh cycles are commenced at approximately every fourth sync pulse from the central processor (2.8 microseconds). A state counter 110 counts the incoming sync pulses from central processor on conductor 101 to define when a refresh operation is desirable. State counter 110 has four states numbered 0,0 through 1,1 which change in recurring binary sequence in response to the sync pulses from the central processor. Accordingly, if state counter 110 is in state 0,0 at a given time, then three sync pulses later it will be in state 1,1. State counter 110 will be in a given state every four sync pulses which occurs approximately every 2.8 microseconds. Control is exercised by state counter 110 by generating a logical "1" on an output conductor 11 while in the 1,1 state and a logical "1" on a conductor 00 while in the 0,0 state. Under normal operation, a refresh operation will be commenced during the state 1,1 unless a memory access request from the central processor began during that state. If such a request has begun, the refresh operation is put off until state 0,0 at which time the memory will be available for refresh. Availability is certain since all memory requests are completed in less than 700 nanoseconds while the next request will not arrive for an additional 700 nanoseconds.

Whenever state counter 110 is in the 1,1 state, a logical "1" is applied as an input to an AND gate 111. AND gate 111 also receives as an input a delayed representation of the sync pulses from central processor (delay sync; FIG. 5). The output of an OR gate 112 is the third input to AND gate 111. OR gate 112 receives as inputs an inverted representation of the signals on conductor 106 and a signal from memory access control circuit 107 denoted 700 plus (FIG. 5). The signal 700 plus becomes a logical "1" during the second 700 nanosecond memory cycle after flip-flop 105 has been enabled. Accordingly, the memory will be available for access during any cycle in which the 700 plus signal is a logical "1". When, during state 1,1, flip-flop 105 stores a logical "0" indicating that no memory access has been requested during this or the preceding cycle, a logical "1" is transmitted from OR gate 112 to AND gate 111 due to the inverted output of flip-flop 105. This logical "1" in combination with the logical "1" indication of state 1,1 and the logical "1" of the delay sync signal causes AND gate 111 to generate a logical "1" output which is transmitted to OR gate 113. Receipt of a logical "1" by OR gate 113 causes it to transmit a logical "1" on conductor 218, thus initiating a refresh cycle in the manner described above. On the other hand, when the flip-flop 105 is generating a logical "1" during state 1,1, a logical "0" is applied as the input to OR gate 112 representing the inverted output of flip-flop 105. If this is the first 700 nanosecond period of a memory access request, the 700 plus signal is also a logical "0." Accordingly, AND gate 111 will not be enabled to start a refresh cycle. The 700 plus signal will be a logical "1" during the following state 0,0. The output signals of state counter 110 on conductor 00 and the 700 plus signal from memory access controller 107 are applied as inputs to an AND gate 114. The combination of state 0,0 and the logical "1" 700 plus signal enables an AND gate 114 to transmit a logical "1" to OR gate 113 thereby enabling a refresh operation during state 0,0. Further, when the logical "0" input to OR gate 112 from flip-flop 105 is received during a state 1,1, which is occurring more than 700 nanoseconds after flip-flop 105 was enabled, a logical "1" 700 plus signal is transmitted via OR gate 112 to AND gate 111. The combination of the delay sync signal, state 1,1 and the logical "1" from OR gate 112 will enable AND gate 111 which in turn starts refresh circuitry during state 1,1.

When operating as above described, a refresh operation will be commenced during every state 1,1 if no central processor memory access requests occur. When such requests do occur, a refresh operation is commenced during either state 1,1 or 0,0, depending on the time those requests are received.

It is also essential to provide a system which will operate when the sync pulses from central processor no longer occur. To this end the present embodiment includes a two-microsecond timer 115 which counts the time intervals between sync pulses from the central processor. If no sync pulse is received for two microseconds, timer 115 enables a 2.8 microsecond pulse circuit 116. Pulse circuit 116 generates a logical "1" pulse every 2.8 microseconds each of which is transmitted via OR gate 113 to flip-flop 217 to continually enable the refresh function. If the central processor sync signals are again resumed the two-microsecond timer 115 disables the 2.8 microsecond pulse circuit 116 and the refresh operations are again controlled from the central processor sync signals.

The preceding description concerns a system having specific characteristics. The principles of the invention, however, can be applied to any dynamic memory system in which the digital words stored thereby are refreshed in groups of n digital words and the memory system stores m such groups of memory words. A first group defining address generator having m possible output states is utilized to control the refresh of all groups of digital words in sequence. A second address generator, having n possible output states, is also employed to select a word from each group refreshed to have its parity checked. The state of the second counter should be incremented after each complete cycle of m group refreshes to provide a new set of digital words for parity check during each successive total memory refresh. When operating as described above, the complete memory will be refreshed after m refresh operations and the parity of the digital words stored will be checked after m×n refresh operations.

We claim:

1. A fault detection arrangement for a dynamic memory system comprising:
   dynamic storage means for storing a plurality of digital words wherein each of said digital words has a unique storage location within said storage means and each of said digital words comprises an information portion and an associated error check portion;
   refresh means for refreshing said dynamic storage means by repetitively performing refresh operations, a predetermined number of said digital words being refreshed during each refresh operation;
   reading means, operative during each refresh operation, for reading from said dynamic storage means one digital word of each of said predetermined number of digital words refreshed; and
   error checking means, responsive to said digital words read by said reading means, for determining if the information portion of each digital word read from said dynamic storage means by said reading means, properly corresponds to its associated error check portion and for generating a fault signal when such proper correspondence does not exist.

2. The fault detection arrangement in accordance with claim 1 further comprising means responsive to said fault signals for storing the unique storage location of the digital word in response to which said fault signals are generated.

3. A fault detection arrangement for a dynamic memory system comprising:
   dynamic storage means for storing a predetermined number of groups of digital words, each of said groups comprising an equal number of digital words wherein each digital word comprises an information portion and an associated error check portion;
   refresh address generating means for periodically generating refresh address signals defining a group of digital words to be refreshed;
   memory refresh means responsive to said refresh address signals for performing refresh operations by refreshing the group of digital words defined by said refresh address signals;
   a fault detection address generating means for generating fault detection address signals defining one digital word of said group of digital words defined by said refresh address generation signals;
   reading means responsive to said fault detection address signals for reading the digital word defined thereby from said dynamic storage means during each refresh operation; and
   error checking means for determining if the information portion of each digital word read from said dynamic storage means by said reading means, properly corresponds to its associated error check portion and for generating fault signals when such proper correspondence does not exist.

4. The fault detection arrangement in accordance with claim 3 wherein said refresh address generating means further comprises means for generating a sequence of refresh address signals, said sequence of refresh address signals being effective to define all of said groups of said digital words stored by said dynamic storage means within a refresh cycle comprised of a number of refresh operations equal to the number of said groups of digital words; and
   wherein said fault detection address generating means further comprises means for generating a predetermined sequence of fault detection address signals, said sequence of fault detection address signals being effective to define all of said digital words stored by said dynamic storage means within a number of said refresh cycles equal to the number of digital words in each of said groups of digital words.

5. The fault detection arrangement in accordance with claim 3 further comprising fault location means responsive to said fault signals for storing said refresh address signals and said fault detection address signals.

6. The fault detection arrangement in accordance with claim 5 further comprising means responsive to said fault signals for inhibiting said fault location means from storing additional refresh address signals and fault detection address signals.

7. A dynamic memory system comprising
   dynamic storage means for storing digital words, each comprising an information portion and an associated error check portion wherein said dynamic storage means stores m groups of said digital words and each of said groups of digital words comprises n digital words;
   a refresh address generating means for generating a recurring sequence of m first address portions, each of said first address portions defining one of said groups of digital words;
   refresh means responsive to said first address portions from said refresh address generating means for refreshing all digital words in the group of said digital words defined thereby;
   fault detection address generating means for generating second address portions, each defining the location of a digital word within said groups of digital words;
   reading means for reading the digital word defined by said second address portions, from each of said groups of digital words refreshed by said refresh means;
   error checking means responsive to each digital word read by said reading means for generating fault signals when the information portion of a given digital word does not properly correspond to the error check code associated with that digital word; and
   incrementing means, connected to said refresh address generation means, for increasing by one the second address portion generated by said fault detection address generating means when said refresh address generating means has generated all m first address portions.

8. The fault detection arrangement in accordance with claim 7 further comprising fault location means responsive to said fault signals for storing the first address portion and the second address portion defining the digital word in response to which said fault signal was generated.

9. The fault detection arrangement in accordance with claim 8 further comprising means responsive to said fault signals for inhibiting said fault location means from storing additional first address portion signals and second address portion signals.

10. A fault detection arrangement for a dynamic memory system comprising dynamic storage means for storing m groups of digital words, each of said groups of digital words comprising n digital words, wherein each of said digital words comprises an information portion and an associated error check portion;

means for generating a succession of refresh enable signals;

refresh address generating means for generating first address portion signals, each of said first address portion signals defining one of said groups of digital words;

means responsive to said refresh enable signals for incrementing the address generated by said refresh address generating means to produce a recurring sequence of the m possible first address portion signals;

refresh means, responsive to said first address portion from said refresh address generating means and said refresh enable signals for refreshing all digital words in the group of said digital words defined by said first address portion;

fault detection address generating means for generating second address portion signals each defining the location of a digital word within said groups of digital words;

reading means for reading the digital word defined by the second address portion signals from each of said groups of digital words refreshed by said refresh means;

error checking means responsive to each digital word read by said reading means for generating fault signals when the information portion of a given digital word does not properly correspond to the error check code associated with that digital word;

incrementing means, connected to said refresh address generation means, for increasing by one the address generated by said fault detection address generating means when said refresh address generating means has generated all m possible first address portions.

11. The fault detection arrangement in accordance with claim 10 further comprising fault location means responsive to said fault signals for storing said first address portion signals and said second address portion signals.

12. The fault detection arrangement in accordance with claim 11 further comprising means responsive to said fault signals for inhibiting said fault location means from storing additional first address portion signals and second address portion signals.

* * * * *